(12) United States Patent
Weis

(10) Patent No.: US 7,078,290 B2
(45) Date of Patent: Jul. 18, 2006

(54) METHOD FOR FORMING A TOP OXIDE WITH NITRIDE LINER

(75) Inventor: Rolf Weis, Dresden (DE)

(73) Assignee: Infineon Technologies AG, Munich (DE)

( * ) Notice: Subject to any disclaimer, the term of this patent is extended or adjusted under 35 U.S.C. 154(b) by 188 days.

(21) Appl. No.: 10/798,865

(22) Filed: Mar. 12, 2004

(65) Prior Publication Data

US 2005/0202634 A1 Sep. 15, 2005

(51) Int. Cl.
*H01L 21/336* (2006.01)

(52) U.S. Cl. ........................ 438/248; 438/268; 438/391

(58) Field of Classification Search ................. 438/248
See application file for complete search history.

(56) References Cited

U.S. PATENT DOCUMENTS

| | | | | |
|---|---|---|---|---|
| 6,063,658 A | * | 5/2000 | Horak et al. ................ | 438/248 |
| 6,236,079 B1 | * | 5/2001 | Nitayama et al. ........... | 257/306 |
| 6,537,870 B1 | * | 3/2003 | Shen ........................... | 438/243 |
| 6,620,699 B1 | * | 9/2003 | Scholz et al. ............... | 438/386 |
| 2002/0196651 A1 | * | 12/2002 | Weis ........................... | 365/100 |
| 2005/0070108 A1 | * | 3/2005 | Divakaruni et al. ........ | 438/690 |

* cited by examiner

*Primary Examiner*—Stephen W. Smoot
(74) *Attorney, Agent, or Firm*—Slater & Matsil, L.L.P.

(57) ABSTRACT

A method for forming a top oxide for a deep trench memory device comprising a poly stud above a polysilicon fill in a deep trench and an isolation region in a portion of the deep trench, comprises forming an etch support nitride liner by low-pressure chemical vapor deposition over the poly stud, and forming a support polysilicon over a portion of the isolation trench outside of an array. The method further comprises depositing a top oxide over the deep trench memory device, forming a planarization coating over the top oxide, and opening the nitride stud, wherein the top oxide remains over a portion of the isolation trench.

22 Claims, 13 Drawing Sheets

To Fig. 1B

METHOD FOR FORMING A TOP OXIDE WITH NITRIDE LINER

BACKGROUND OF THE INVENTION

1. Field of the Invention

The present disclosure relates to semiconductor devices, and more particularly to a method for forming a top oxide with a nitride liner.

2. Discussion of Prior Art

Semiconductor memory devices such as dynamic random access memories (DRAM) typically include memory cells. These memory cells comprise storage nodes. These storage nodes can be formed within deep trenches etched into substrate of a semiconductor memory chip. The storage nodes can be accessed using an access transistor, which allows a charge to be stored in the storage node or retrieved from the storage node depending on a desired action, e.g., a read function or a write function. Electrical isolation of the storage node from a gate conductor can be important to the performance of the device.

A top trench oxide layer formed over the storage node provides electrical isolation between the storage node and gate conductor. Each storage node typically includes a polysilicon material that partially fills the deep trench. During fabrication of the device, a recess can be formed at the top of the trench. An oxide, for example, silicon oxide, can be formed over the device including the polysilicon in the trench. Portions of the deposited oxide can be removed by planarizing the surface of the device and by recessing the oxide to leave an oxide layer at the bottom of the recess, for example, 5–50 nm of material. This oxide layer is referred to as a trench top oxide or isolation.

Similar to the trench top oxide, a top oxide for vertical transistors provides electrical isolation. The top oxide isolates the gate conductor from the substrate. An electrical connection can be formed between the gate conductor wiring layer on the wafer surface and the vertical gate conductor in the trench. Methods for forming the top oxide typically involve complex process flows, which can add to the cost of manufacturing the DRAM devices. In addition, exposed arrays during processing can result in irregularities in the DRAM device affecting device performance.

Therefore, a need exists for a method for structuring a top oxide with a nitride liner having a reduced number of process steps and a protected stud during processing.

SUMMARY OF THE INVENTION

According to an embodiment of the present disclosure, a method for forming a top oxide for a vertical transistor device comprising a poly stud above a polysilicon fill in a deep trench and an isolation region in a portion of the deep trench, comprises forming an etch support nitride liner by low-pressure chemical vapor deposition over the poly stud, and forming a support polysilicon over a portion of the isolation trench outside of an array. The method further comprises depositing a top oxide over the vertical transistor device, forming a planarization coating over the top oxide, and opening the nitride stud, wherein the top oxide remains over a portion of the isolation trench.

The method further comprises forming a nitride cap above the poly-stud above a polysilicon fill in a deep trench.

Forming an etch support nitride liner further comprises forming implants.

The implants are formed in a well, a support device, or both the well and the support device.

The method further comprises performing a support gate oxidation prior to forming the support polysilicon, wherein the polysilicon stud is protected from the support gate oxidation by the etch support nitride liner.

Forming the support polysilicon further comprises depositing an etch array polysilicon over the memory device, applying an etch array mask over a portion of the etch array polysilicon, etching the etch array polysilicon, and exposing a pad oxide on the substrate.

Opening the polysilicon stud comprises depositing a planarization coating, etching the planarization coating with a selectivity to oxide of 1:1, and selective to polysilicon, wherein the polysilicon in the support is either high enough to clear the top oxide or, where the top oxide in the support can be removed by a mask.

Opening the polysilicon stud comprises an etch of the planarization coating, selective to oxide 1:1, wherein the etch has an endpoint upon the exposure of the polysilicon cap.

Opening the polysilicon stud comprises an oxide etch of the top oxide, planarization coating 1:>2, selective to polysilicon, having an endpoint upon the removal to the organic planarization coating. The method further comprises a timed etch oxide 1:1, removing a portion of the polysilicon cap.

According to an embodiment of the present disclosure, a method for forming a top oxide for a vertical transistor device comprises providing a substrate, and forming a storage node in the substrate comprising a deep trench filed with a doped polysilicon. The method further comprises forming a polysilicon stud above the doped polysilicon in the deep trench, forming an isolation trench in an upper portion of the storage node and substrate, and forming a patterned etch support liner over a portion of the polysilicon stud, wherein the patterned etch support liner and the doped polysilicon fully encompass the polysilicon stud. The method comprises depositing a top oxide over the vertical transistor device, forming a planarization coating over the top oxide, and opening the stud to expose the polysilicon stud, wherein portions of the top oxide are preserved above the substrate and above the isolation trench.

Forming the isolation trench comprises forming a pad nitride over a portion of the deep trench memory device exposing a portion of the substrate and the polysilicon stud, and etching an isolation trench in the exposed portion of the substrate and the nitride stud. Forming the isolation trench further comprises filling the isolation trench with an insulated material, removing the pad nitride to expose the substrate, and performing an oxide deglaze.

Opening the nitride stud comprises etching the planarization coating with a selectivity to oxide of 1:1, and selective to polysilicon, wherein the polysilicon in the support is either high enough to clear the top oxide or, where the top oxide in the support can be removed by a mask.

Opening the polysilicon stud comprises an etch of the planarization coating, selective to oxide 1:1, wherein the etch has an endpoint upon the exposure of the polysilicon stud.

Opening the polysilicon stud comprises an oxide etch of the top oxide, planarization coating 1:>2, selective to polysilicon, having an endpoint upon the removal to the organic planarization coating. The method further comprises a timed etch oxide 1:1, removing a portion of the polysilicon stud.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

A top oxide process is needed for vertical transistors to isolate the gate conductor from the substrate and to form an electrical connection between a gate conductor wiring layer and the vertical gates. Isolation is important, because, among other reasons, the gate conductor is used at the same time as a gate electrode for planar transistors in the support region of the substrate. U.S. patent application Ser. No. 20020196651, filed Jun. 22, 2001, entitled Memory Cell Layout with Double Gate Vertical Array Transistor, describes a method for top oxide formation by deposition and planarization, and is incorporated herein by reference in its entirety.

The present disclosure provides an improved method for forming a top trench isolation layer over a storage node in a deep trench, wherein an array is covered by a nitride liner preventing out doping, and a stud is not exposed to a gate oxidation.

Figure 1A:
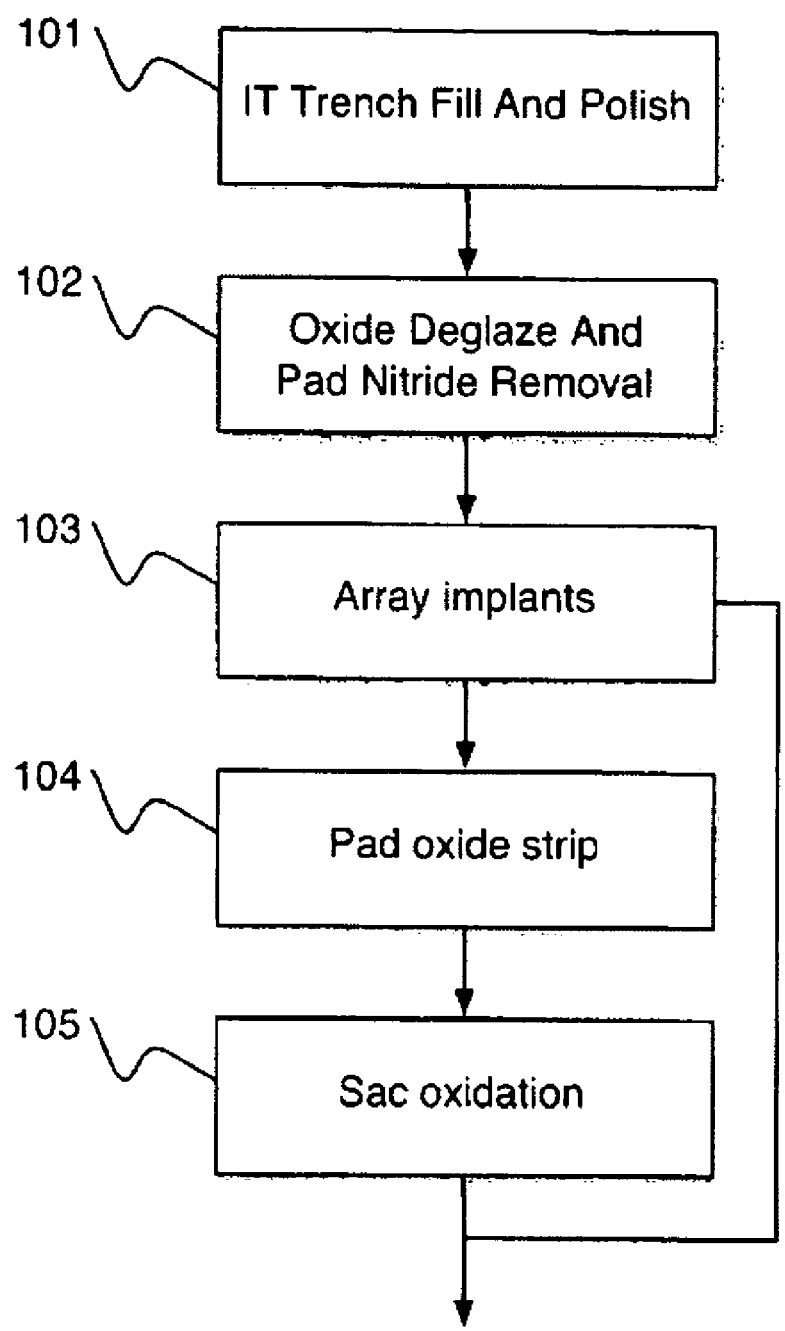
FIGS. 1A to 1C are a flow chart of a method according to an embodiment of the present disclosure.
Figure 1B:
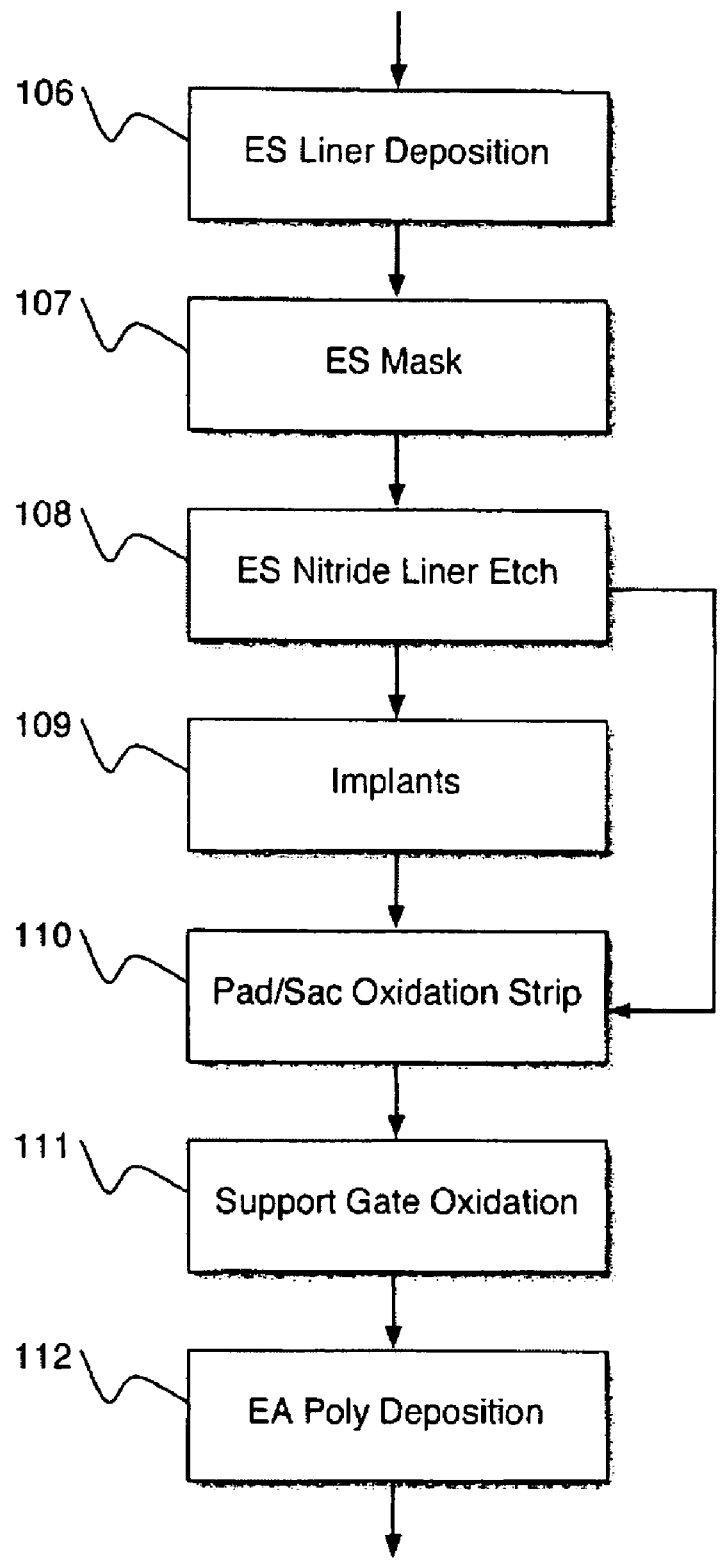
Figure 1C:
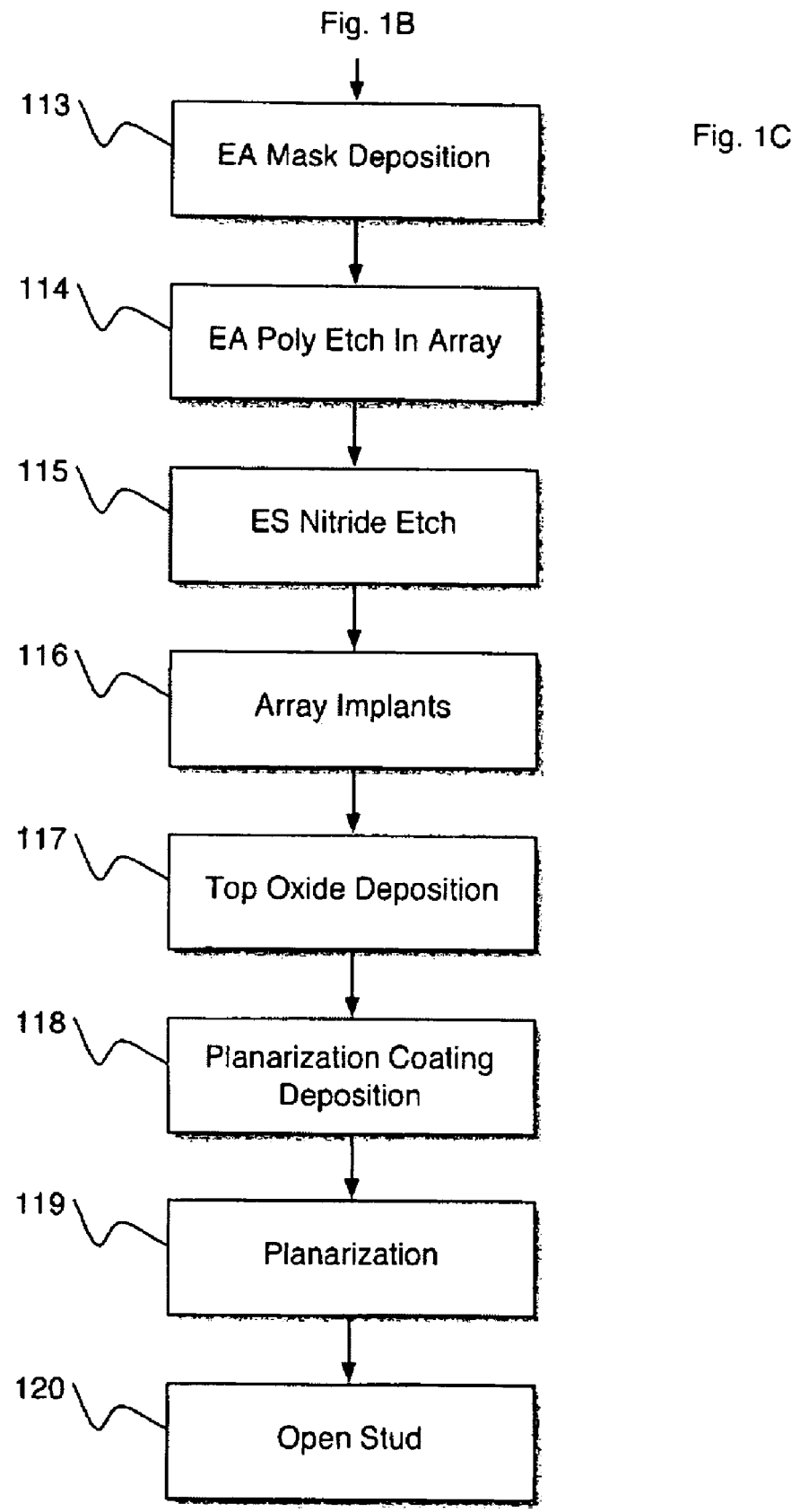

Referring to FIGS. 1A to 1C, a method for forming a top oxide over an isolation trench of a storage node comprises forming an isolation trench (IT), wherein the IT is filled and polished 101. The IT electrically isolates each active array region formed on each side of the deep trench. An oxide deglaze can be performed to remove contaminants and a pad nitride can be removed to expose the substrate 102. Array implants can be formed on the device 103. Optionally, a portion of the pad oxide can be removed 104, for example, by hydrofluoric acid (HF), and a layer of sacrificial oxide can be formed over the device 105. An etch support (ES) nitride liner can be deposited over the device 106. Optionally, an in situ steam generation (ISSG) oxidation can be performed to create an oxide layer to be structured by resist. The pattern in the oxide can be used for etching the ES nitride liner with high selectivity. The ES nitride liner can be masked 107, followed by an ES nitride liner etch to pattern the ES liner 108. Implants can be added to wells and support devices as needed 109. Support devices include, for example, read/write/erase control circuits and decoders. A sacrificial oxidation strip can remove the layer of sacrificial oxide 110. Support gate oxidation 111 prepares the surface of the device for a support polysilicon. An etch array (EA) polysilicon can be deposited 112, followed by the application of an EA mask 113. The support polysilicon or EA polysilicon can be etched from the array (e.g., by blockmask) 114. An ES nitride etch (of the material deposited in 109) can expose the oxide on the substrate and IT by removing portions of the ES nitride liner 115. This can also be performed as a spacer-etch. Any desired array implants can be formed 116. A top oxide can be deposited 117.

An organic planarizing coating 118, e.g., an antireflective coating (ARC), can be deposited. The organic planarizing coating can be planarized 119. A reactive ion etch (RIE) of the coating layer, e.g., with a selectivity of 1:1 (organic coating to oxide), selective to polysilicon, can be performed to open the polysilicon stud 120, wherein the polysilicon in the support is high enough to clear the top oxide. Alternatively, a second ES mask can be used to remove the oxide on the polysilicon.

Figure 2:
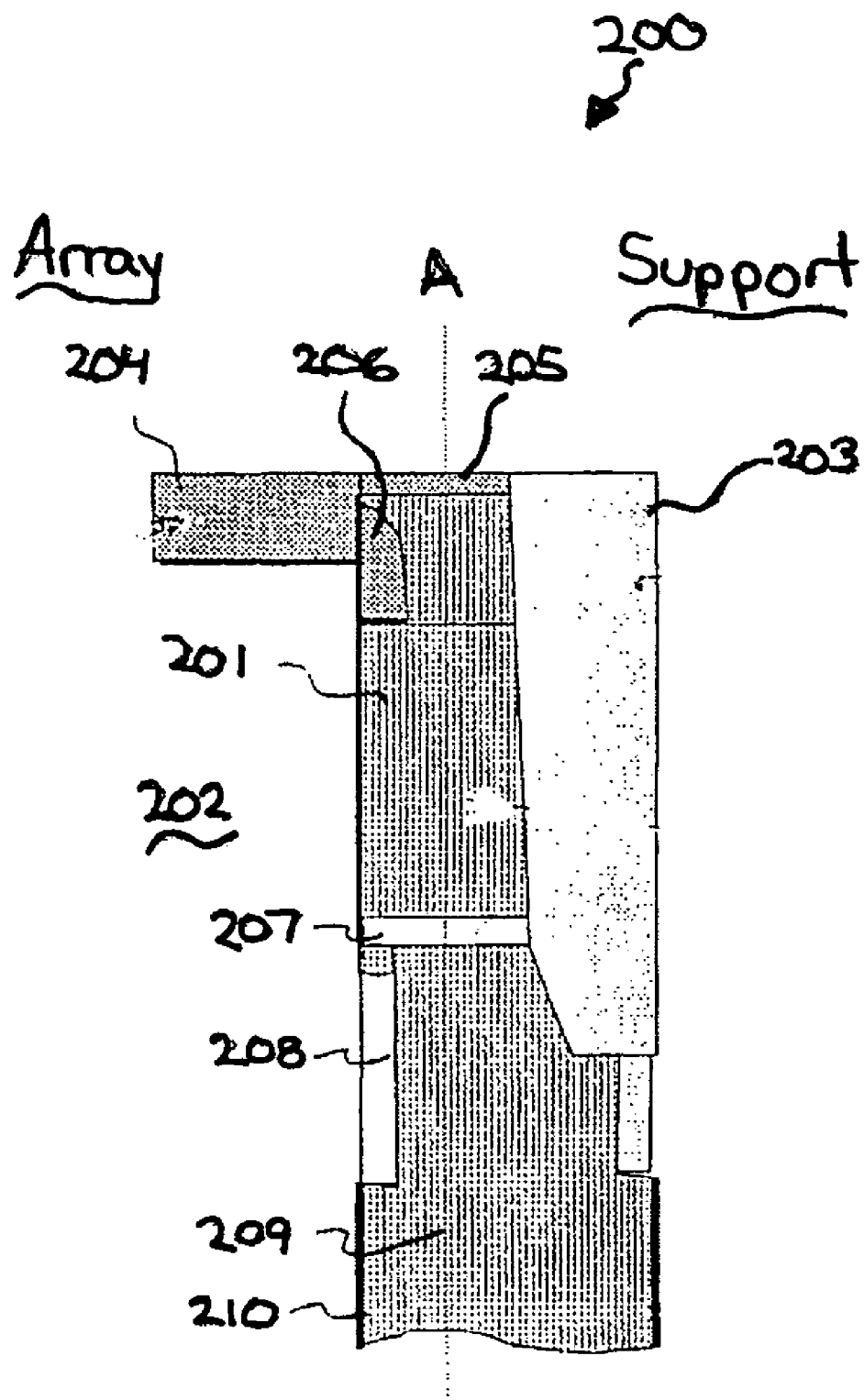
FIG. 2 is a diagram of a cross-section of a transistor according to an embodiment of the present disclosure.

Referring now to FIG. 2, a storage node 200 comprises a deep trench (DT) filed with polysilicon 201 formed in a substrate 202, an IT 203 is polished, for example, by chemical-mechanical polish (CMP), to a pad nitride surface 204. A DT nitride cap 205 is above a portion of a spacer 206 and the polysilicon 201. The spacer 206 may be formed of nitride. The spacer 206 may be omitted. Also shown are the top trench oxide 207, the trench collar oxide 208, and a polysilicon 209 of the lower portion of the deep trench. The polysilicon 209 can be highly doped when deposited to form a buried strap (described with respect to FIG. 11). A node dielectric 210 lines the lower portion of the deep trench. Techniques for forming the top trench oxide 207, the trench collar oxide 208, the polysilicon 209, and node dielectric 210 would be obvious to one of ordinary skill in the art.

An oxide deglaze is performed to remove contaminants. The pad nitride is removed to expose the pad oxide in the substrate, e.g., the p-well. Array implants can be formed on the device. Optionally, a portion of the pad oxide can be removed. A layer of sacrificial oxide can be formed over the device.

Figure 3:
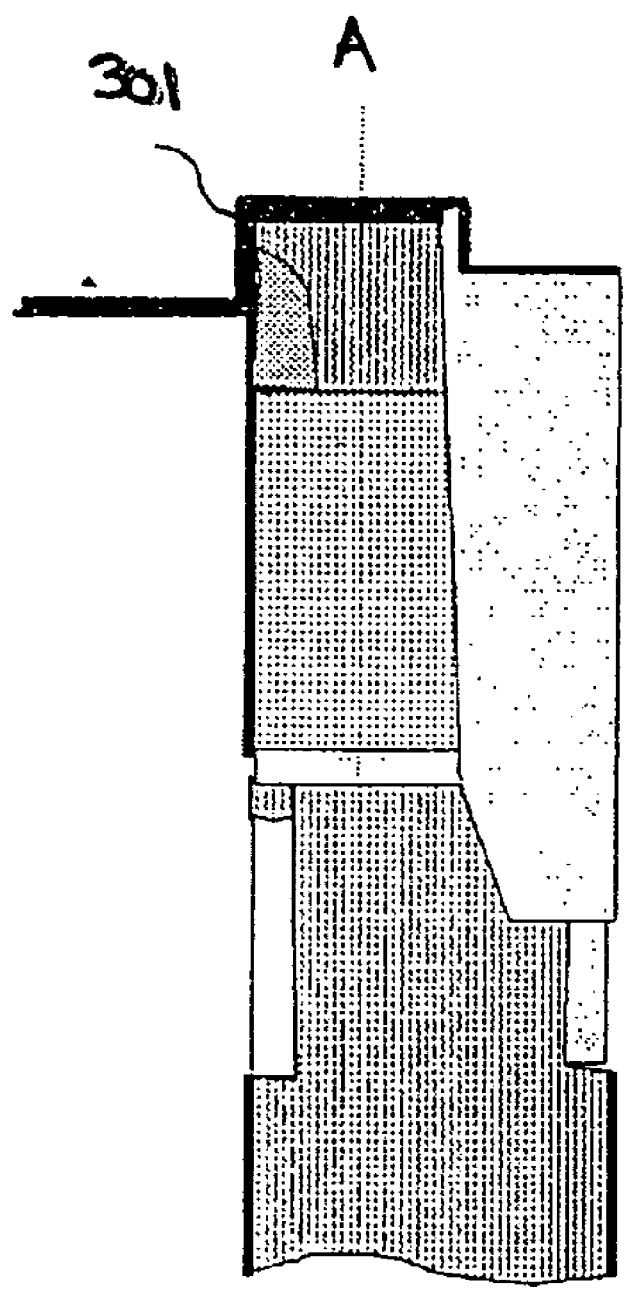
FIG. 3 is a diagram of a cross-section of a transistor according to an embodiment of the present disclosure.

Referring to FIG. 3, an ES liner 301 can be deposited over the device. Optionally, an ISSG oxidation can be performed to form a hardmask for structuring the ES liner 301. The ES liner can be masked, followed by an ES nitride liner etch to pattern the ES liner 301. The etch can be by, for example, RIE or using the oxide hardmask above with a hydrofluoric acid (HF) etch. Implants can be added to wells and support devices as needed.

Figure 4:
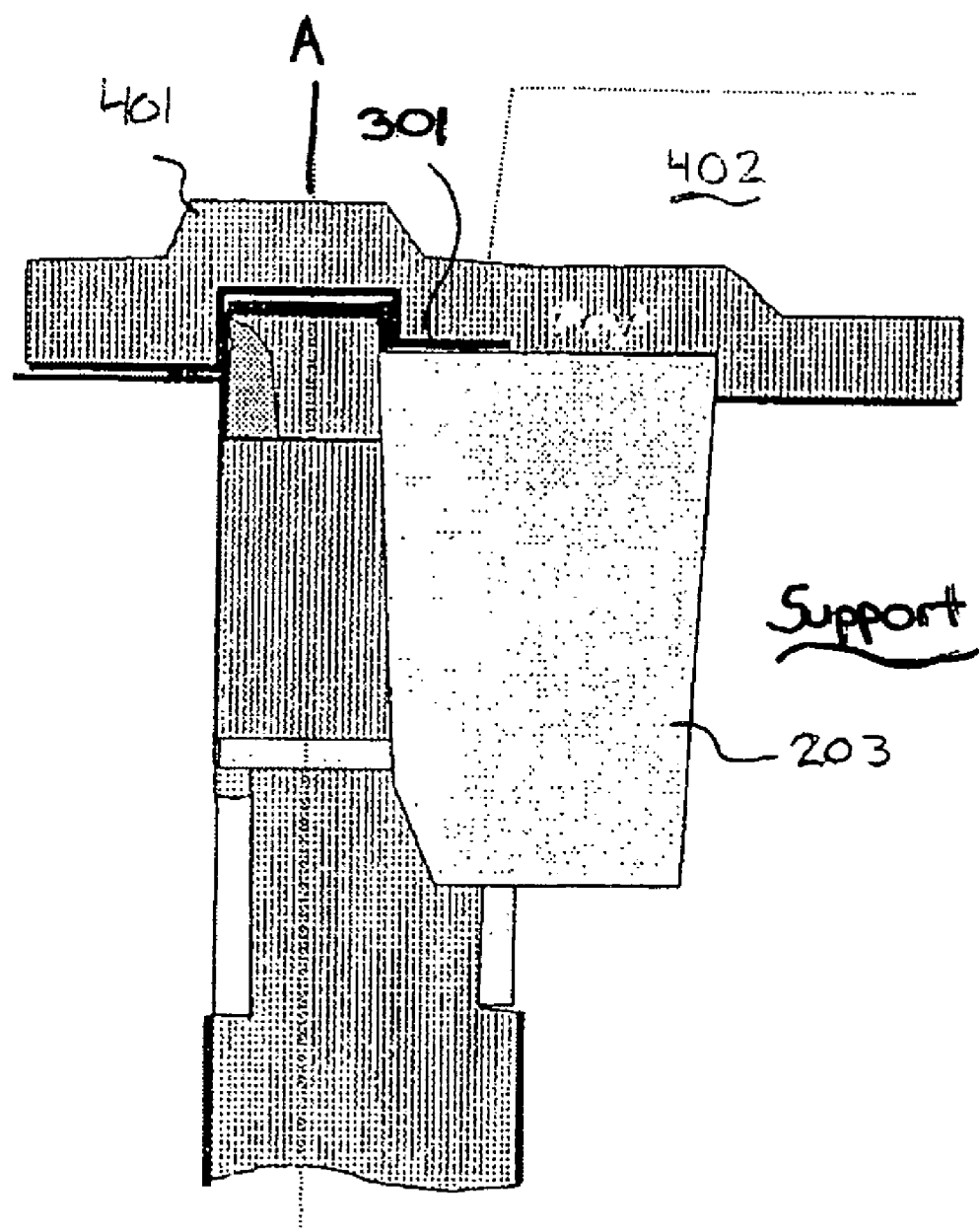
FIG. 4 is a diagram of a cross-section of a transistor according to an embodiment of the present disclosure.

Referring to FIG. 4, a sacrificial oxidation strip removes the layer of oxide (not shown) in the support. Support gate oxidation prepares the surface of the device for receiving a support polysilicon 401. An EA mask 402 can be applied.

Figure 5:
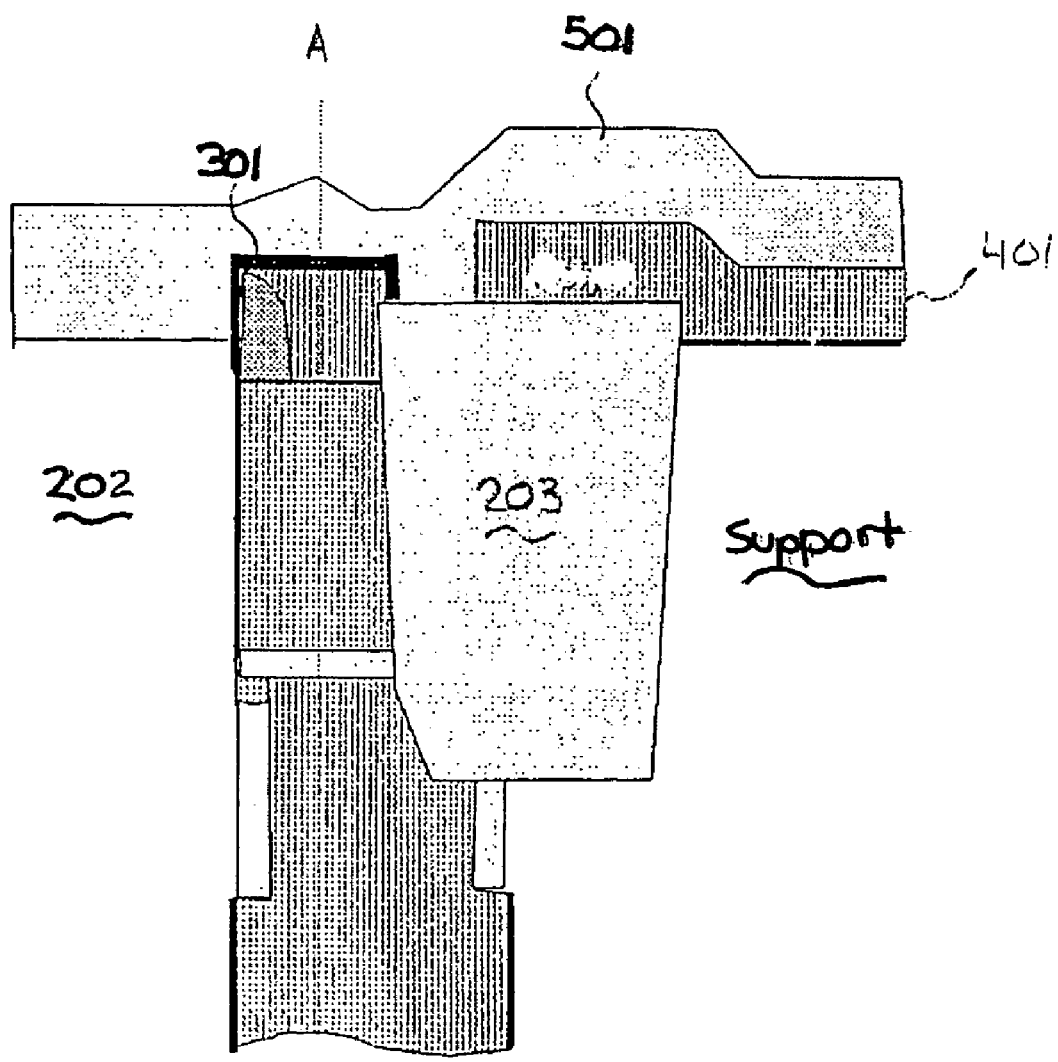
FIG. 5 is a diagram of a cross-section of a transistor according to an embodiment of the present disclosure.

Referring to FIG. 5, the EA polysilicon 401 in the array can be etched, with a block mask. An EA nitride-etch can expose the pad oxide on the substrate 202 and isolation trench 203 by removing portions of the ES liner 301. This can also be performed as a spacer-etch. Any desired array implants can be formed. A top oxide 501 can be deposited.

Figure 6:
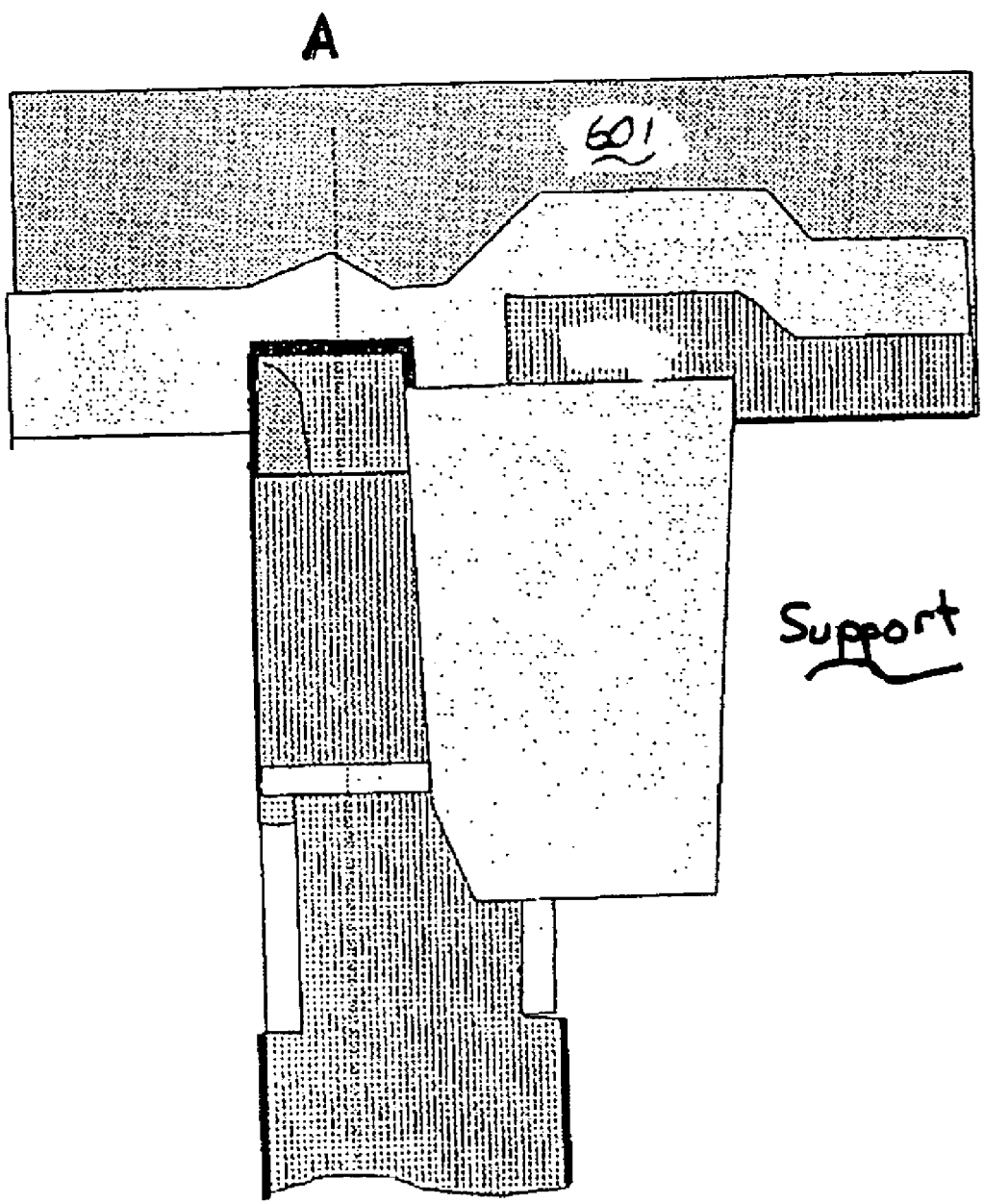
FIG. 6 is a diagram of a cross-section of a transistor according to an embodiment of the present disclosure.

An organic planarization coating 601, as shown in FIG. 6, can be formed. The organic planarization coating 601 can be for example, an ARC.

Figure 7:
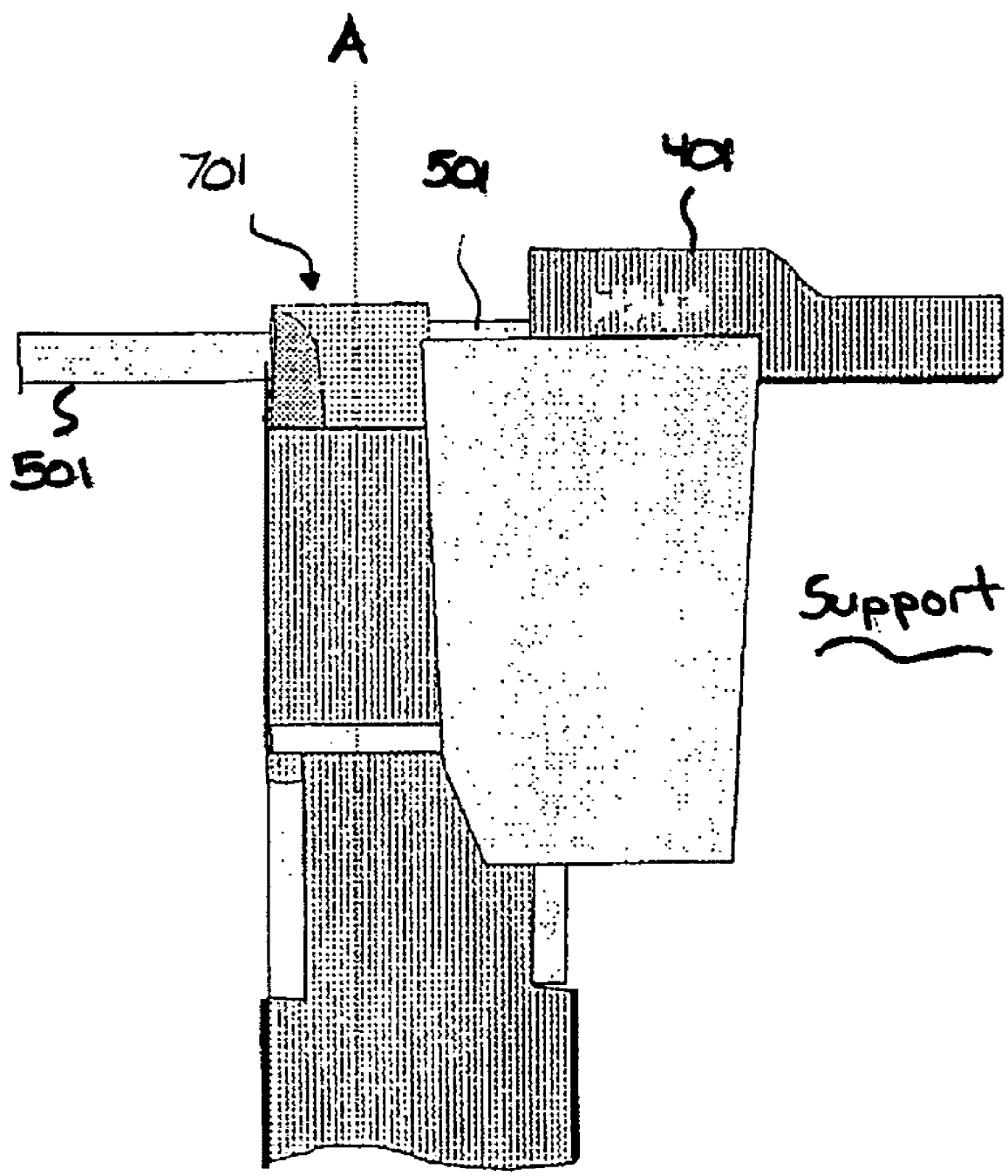
FIG. 7 is a diagram of a cross-section of a transistor according to an embodiment of the present disclosure.
Figure 8:
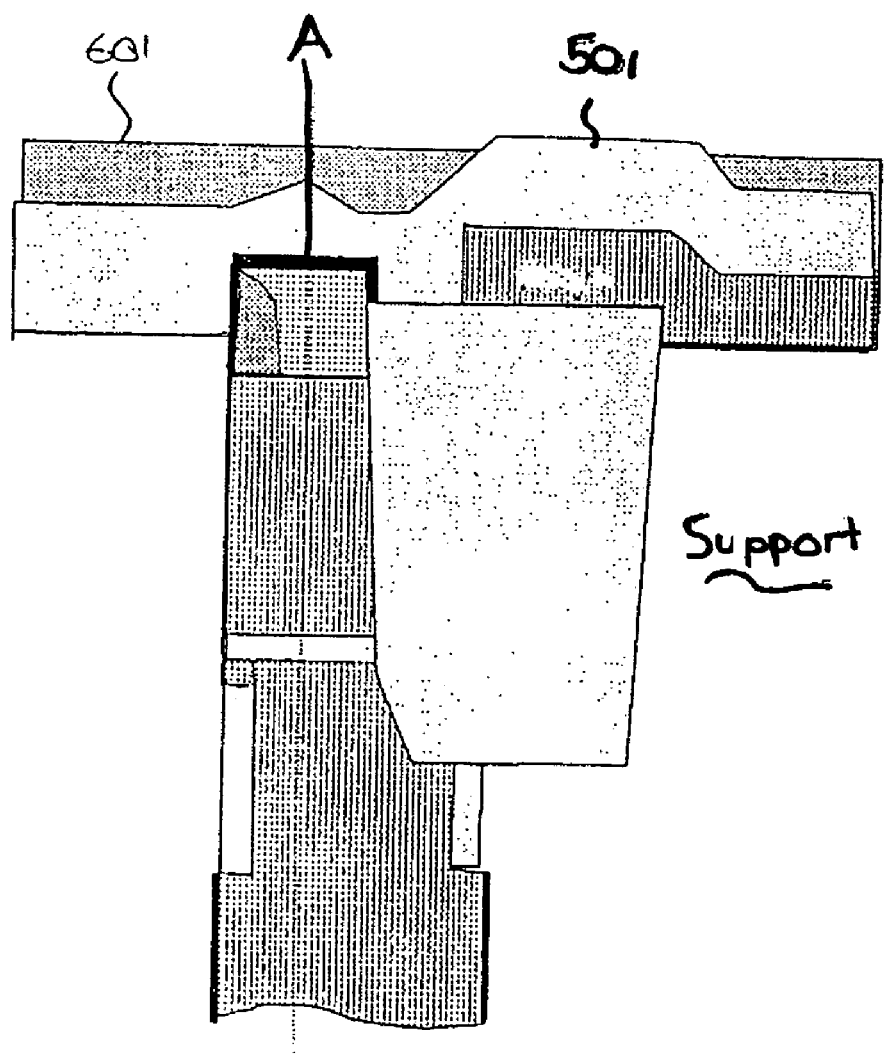
FIG. 8 is a diagram of a cross-section of a transistor according to an embodiment of the present disclosure.
Figure 9:
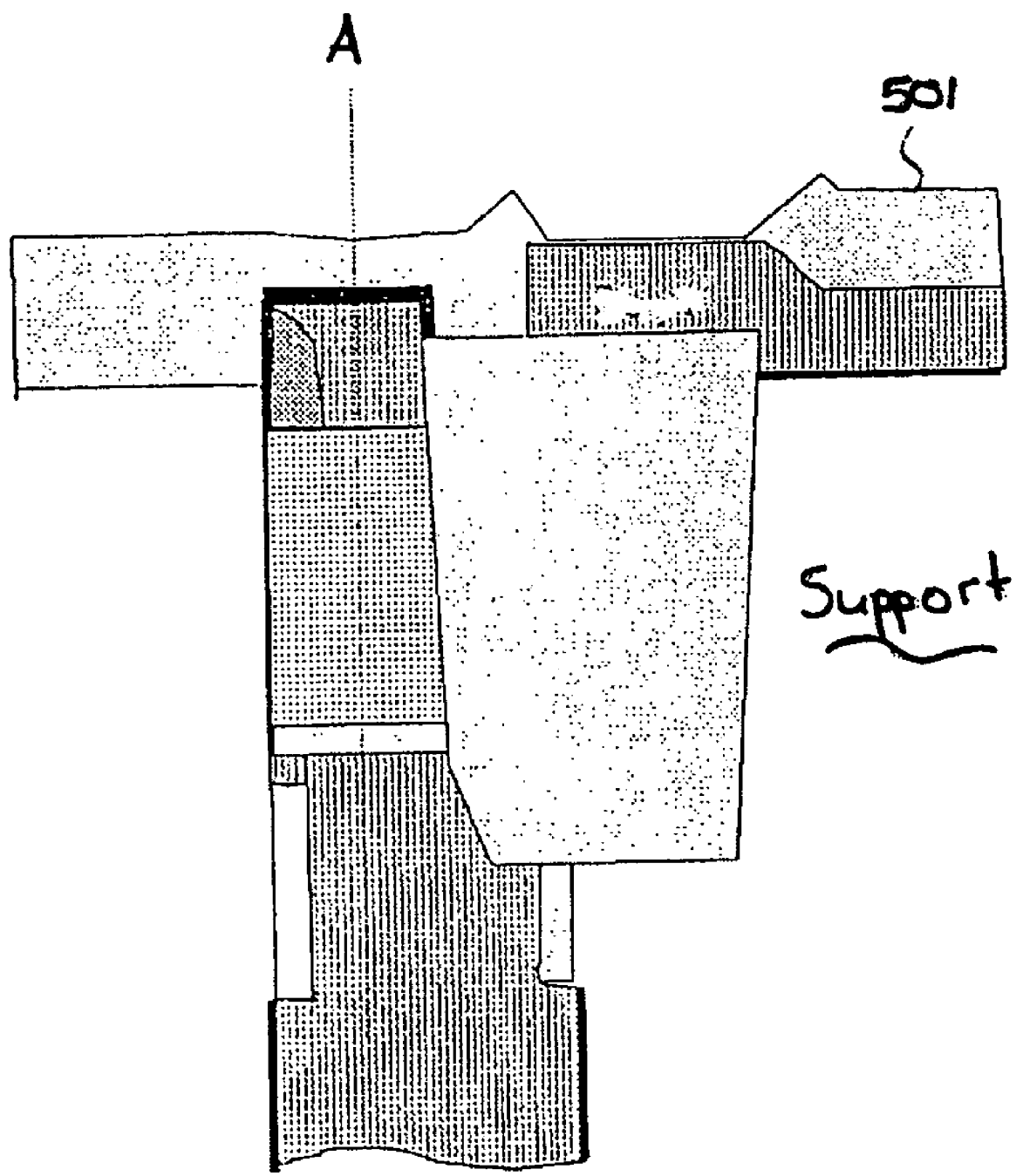
FIG. 9 is a diagram of a cross-section of a transistor according to an embodiment of the present disclosure.

Referring to FIG. 7, an RIE of the ARC layer, e.g., with a selectivity to oxide of 1:1, and selective to polysilicon, can be performed to open the polysilicon stud 701, wherein the polysilicon in the support 401 is either high enough to clear the top oxide 501 or, where the top oxide in the support area can be removed by an ES mask. Alternatively, an RIE of the ARC layer 601, e.g., oxide 1:1, can be performed having an endpoint upon the exposure of the top oxide 501, as shown in FIG. 8. An oxide etch of the top oxide 501 can be performed as shown in FIG. 9, e.g., ARC 1:>2, selective to polysilicon, having an endpoint upon the removal to the ARC layer 601. Further, a timed RIE oxide 1:1 can be performed, removing a portion of the top oxide 501 as shown in FIG. 9. The RIE can be an oxide-etch selective to polysilicon 401 until the polysilicon stud 701 is free as shown in FIG. 10.

Figure 10:
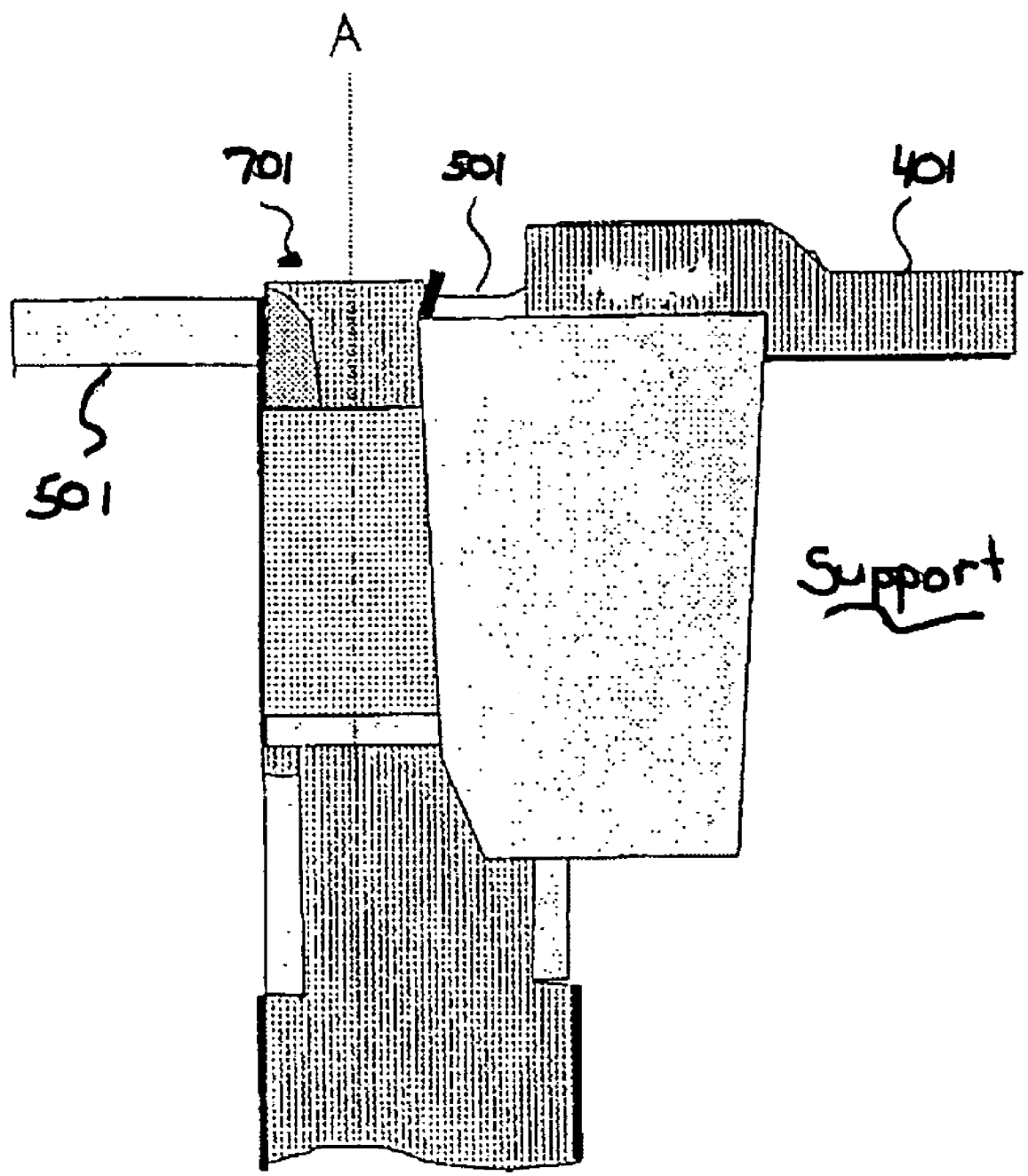
FIG. 10 is a diagram of a cross-section of a transistor according to an embodiment of the present disclosure.
Figure 11:
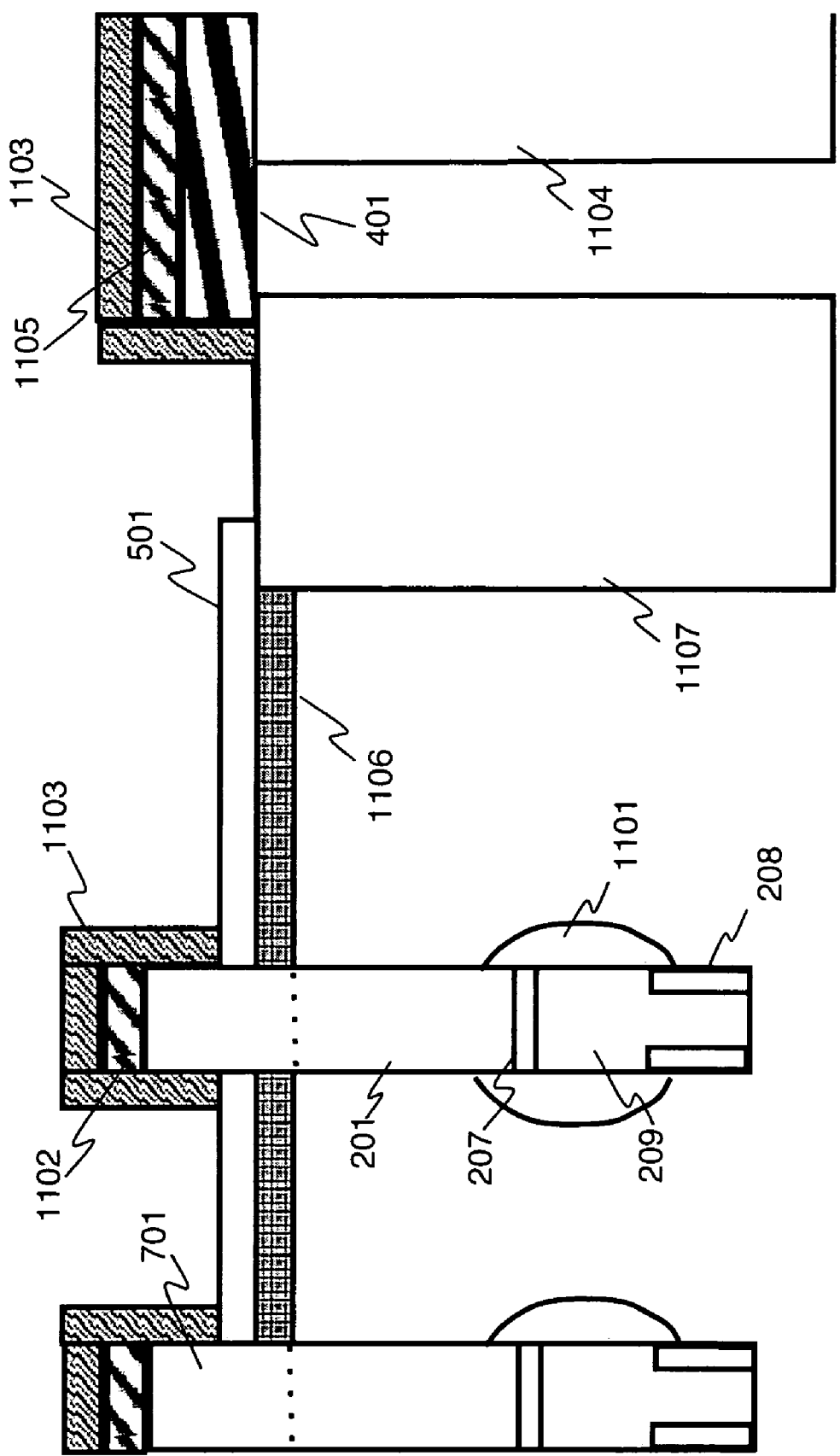
FIG. 11 is a diagram of a cross section taken along cleave line A in FIG. 10.

Referring to FIG. 11, a wordline/support gate stack is illustrated along the cleave line A shown in FIG. 10 taken through an active array region on each side of the deep trench. A buried plate (not shown) forms one plate of the capacitor. A dielectric layer, formed of oxide or nitride, or a combination, lines the deep trench forming a node dielectric as shown in FIG. 2. A trench collar oxide 208 is formed in the trench below the top trench oxide 207. Doped polysilicon 209 formed within a lower portion of the deep trench acts as a second plate. A buried strap 1101 is a lower junction, wherein the polysilicon 201 forms a gate between the buried strap 1101 and the upper junction 1106. The structure shown in FIG. 11 can be manufactured given the unstructured gate stack of FIG. 10 by known techniques. For example, by depositing a metal stack followed by a gate nitride layer, performing gate/mask structuring, and a spacer process. The spacer process forms a spacer around the wordline. More particularly, as shown in FIG. 11, a wordline stack 1102 is deposited over the polysilicon stud 701 and top oxide 501. The wordline stack 1102 is preferably a multilayer stack of polysilicon and tungsten. The spacer 1103 encompasses the wordline 1102. Also shown are a transition region 1107 and a support isolation trench 1104 underlying a support gate stack 1105.

Having described embodiments for a system and method for forming a top oxide with a nitride liner, it is noted that modifications and variations can be made by persons skilled in the art in light of the above teachings. It is therefore to be understood that changes may be made in the particular embodiments of the invention disclosed which are within the scope and spirit of the invention as defined by the appended claims.

What is claimed is:

1. A method for forming a top oxide for a semiconductor device comprising a polysilicon stud above a polysilicon fill in a deep trench formed in a substrate, and an isolation region in a portion of the deep trench, the method comprising the steps of:
    forming a nitride liner over the polysilicon stud;
    forming a support polysilicon over a portion of the isolation trench outside of an array;
    depositing a top oxide over the semiconductor device;
    forming a planarization coating over the top oxide; and
    opening the polysilicon stud.

2. The method of claim 1, further comprising forming a poly cap above the polysilicon stud above a polysilicon fill in a deep trench.

3. The method of claim 1, wherein forming a nitride liner further comprises forming implants.

4. The method of claim 3, wherein the implants are formed in a well, a support device, or both the well and the support device.

5. The method of claim 1, further comprising performing a support gate oxidation prior to forming the support polysilicon, wherein the polysilicon stud is protected from the support gate oxidation by the nitride liner.

6. The method of claim 1, wherein the step of forming the support polysilicon further comprises:
    depositing an etch array polysilicon over the semiconductor device;
    applying an etch array mask over a portion of the etch array polysilicon;
    etching the etch array polysilicon; and
    exposing a pad oxide on the substrate.

7. The method of claim 1, wherein the step of opening the polysilicon stud comprises:
    applying a planarization coating; and
    etching the planarization coating with a selectivity to oxide of 1:1, and selective to polysilicon, wherein the polysilicon in the support is either high enough to clear the top oxide or, wherein the top oxide can be removed using a mask.

8. The method of claim 1, wherein the step of opening the polysilicon stud comprises an etch of the planarization coating, selective to oxide 1:1, wherein the etch has an endpoint upon the exposure of the polysilicon stud.

9. The method of claim 1, wherein the step of opening the polysilicon stud comprises an oxide etch of the top oxide, planarization coating 1:>2, selective to polysilicon, having an endpoint upon the removal to the planarization coating.

10. The method of claim 9, further comprising a timed etch oxide 1:1, removing a portion of the top oxide.

11. A method for forming a top oxide for a vertical transistor device comprising the steps of:
    providing a substrate;
    forming a storage node in the substrate comprising a deep trench filled with a doped polysilicon;
    forming a polysilicon stud above the doped polysilicon in the deep trench;
    forming an isolation trench in an upper portion of the storage node and substrate;
    forming a patterned etch support liner over a portion of the polysilicon stud, wherein the patterned etch support liner and the doped polysilicon fully encompass the polysilicon stud;
    depositing a top oxide over the vertical transistor device;
    forming a planarization coating over the top oxide; and
    opening the stud to expose the polysilicon stud, wherein portions of the top oxide are preserved above the substrate and above the isolation trench.

12. The method of claim 11, wherein forming the isolation trench further comprises:
    forming a pad nitride over a portion of the deep trench exposing a portion of the substrate and the polysilicon stud;
    etching an isolation trench in the exposed portion of the substrate and the polysilicon stud;
    filling the isolation trench with an insulating material;
    removing the pad nitride to expose the substrate; and
    performing an oxide deglaze.

13. The method of claim 11, wherein the step of opening the polysilicon stud comprises etching the planarization coating with a selectivity to oxide of 1:1, and selective to polysilicon, wherein the polysilicon in the support is either high enough to clear the top oxide or, where the top oxide can be removed by a mask.

14. The method of claim 11, wherein the step of opening the polysilicon stud comprises an etch of the planarization coating, selective to oxide 1:1, wherein the etch has an endpoint upon the exposure of the polysilicon stud.

15. The method of claim 11, wherein the step of opening the polysilicon stud comprises an oxide etch of the top oxide, planarization coating 1:>2, selective to polysilicon, having an endpoint upon the removal to the planarization coating.

16. The method of claim 15, further comprising a timed etch oxide 1:1, removing a portion of the top oxide.

17. The method of claim 11, wherein forming a liner comprises forming an etch support nitride liner.

18. The method of claim 11, wherein forming a liner comprises forming a nitride liner by low-pressure chemical vapor deposition.

19. The method of claim 11, wherein opening the polysilicon stud comprises opening the poly stud such that the top oxide remains over a portion of the isolation trench.

20. The method of claim 11, wherein the deep trench is formed in a semiconductor body and wherein opening the polysilicon stud comprises opening the polysilicon stud such that the top oxide remains over the vertical transitor device adjacent the deep trench.

21. A method of forming a semiconductor device, the method comprising:

forming a trench in a semiconductor body;
forming a conductive stud in at least an upper portion of the trench;
forming an isolation region in at least the upper portion of the trench adjacent the conductive stud;
forming a liner over the conductive stud;
forming a conductor over the trench so that the conductor overlies the conductive stud and the isolation region;
removing a portion of the conductor over the conductive stud;
depositing a top insulator over the semiconductor body including over the isolation region, the conductive stud, and remaining parts of the conductor;
forming a planarization layer over the top insulator; and
removing portions of the top insulator and the planarizing layer so as to expose an upper surface of the conductive stud.

22. The method of claim 21 wherein:
the conductive stud comprises a polysilicon stud;
the liner comprises a nitride liner;
the conductor comprises polysilicon; and
the top insulator comprises an oxide.

* * * * *